(12) United States Patent
Asano

(10) Patent No.: US 8,489,910 B2
(45) Date of Patent: Jul. 16, 2013

(54) TIMING CONTROLLER, TIMING CONTROL METHOD, AND TIMING CONTROL SYSTEM

(75) Inventor: Shigetaka Asano, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 356 days.

(21) Appl. No.: 12/817,692

(22) Filed: Jun. 17, 2010

(65) Prior Publication Data

US 2010/0321078 A1 Dec. 23, 2010

(30) Foreign Application Priority Data

Jun. 19, 2009 (JP) ................................. 2009-146905

(51) Int. Cl.
| | |
|---|---|
| G06F 1/00 | (2006.01) |
| G05F 1/00 | (2006.01) |
| H02M 3/156 | (2006.01) |
| H02M 1/12 | (2006.01) |
| H03K 17/00 | (2006.01) |
| G09G 3/14 | (2006.01) |
| G09G 3/32 | (2006.01) |
| F21V 7/04 | (2006.01) |

(52) U.S. Cl.
USPC ........... 713/500; 713/501; 315/291; 323/271; 323/282; 323/351; 327/127; 345/39; 345/82; 362/612; 363/41

(58) Field of Classification Search
USPC .................. 713/500, 501; 315/291; 323/271, 323/282, 351; 327/124; 345/39, 82; 362/612; 363/41
See application file for complete search history.

(56) References Cited

U.S. PATENT DOCUMENTS

| | | | | |
|---|---|---|---|---|
| 5,323,438 | A * | 6/1994 | Kim | 377/54 |
| 5,898,329 | A * | 4/1999 | Hopkins | 327/176 |
| 2007/0262948 | A1* | 11/2007 | Han et al. | 345/102 |
| 2010/0301764 | A1* | 12/2010 | Liu | 315/250 |

FOREIGN PATENT DOCUMENTS

JP 2008-091311 A 4/2008

* cited by examiner

*Primary Examiner* — Stefan Stoynov
(74) *Attorney, Agent, or Firm* — Arent Fox LLP

(57) ABSTRACT

A timing controller includes a controller that controls an operation timing of a controlled unit, and a setting unit that associates a timing obtained by dividing a setting of the operation timing into a plurality of timings, each timing having an identification number, and sets the control unit so that an offset period based on the associated timing is added to the operation timing of the controlled unit.

10 Claims, 6 Drawing Sheets

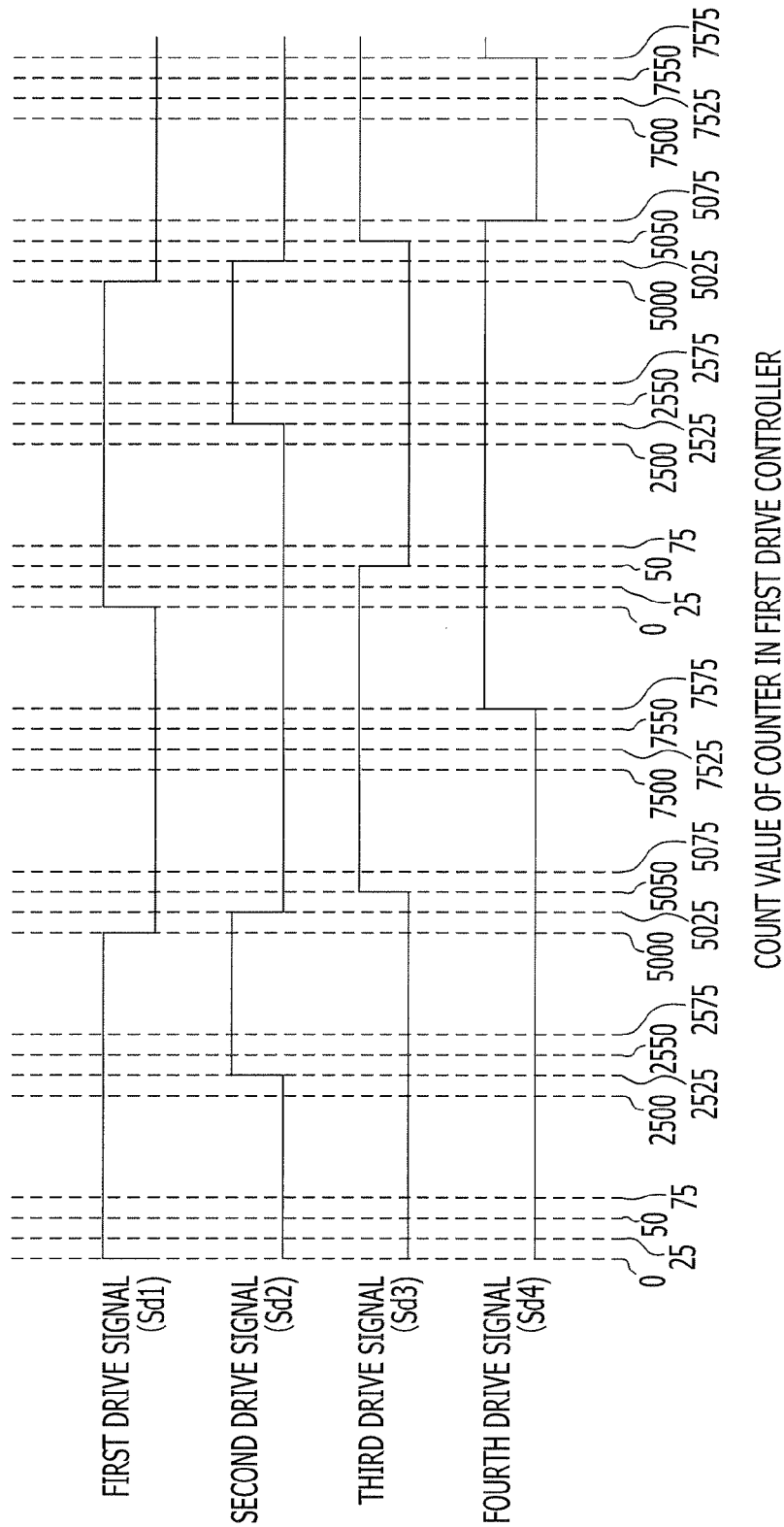

TIMING CONTROLLER, TIMING CONTROL METHOD, AND TIMING CONTROL SYSTEM

CROSS-REFERENCE TO RELATED APPLICATION

This application claims the benefit of priority of the prior Japanese Patent Application No. 2009-146905, filed on Jun. 19, 2009, the entire contents of which are incorporated herein by reference.

FIELD

The current application relate to a timing controller. The current application relates to a timing control method, and a timing control system.

BACKGROUND

A pulse width modulation (PWM) control may be used for controlling brightness, electric power, and driving a motor, etc. For example, in a lighting device that uses a light emitting diode (LED) as a light source that illuminates with a certain color when a current is applied, the brightness of the LED is modulated by pulse width modulation (PWM) control. In other words, the brightness of the LED is modulated by controlling a duty ratio of a period of time during which a current is applied over a period of time during which the current is not applied to the LED. For example, the longer the time during which a current is applied to turn on the LED with respect to the time during which no current is applied to turn off the LED, the brighter the LED becomes. Conversely, the shorter the time during which a current is applied to turn on the LED with respect to time during which no current is applied to turn off the LED, the more the brightness of the LED decreases.

When there is a plurality of controlled objects of PWM control, the plurality of controlled objects are turned on and off substantially simultaneously (for example, a plurality of LEDs are turned on and off). In this case, there is a drawback in that power supply variation takes place.

For example, a plurality of LEDs are used as a light in an automobile vehicle such as a speedometer, an oddmeter, an audio device, a display panel such as for an air conditioner, and a lighting apparatus for an interior light. In this case, when the plurality of LEDs is turned on and off substantially simultaneously, noise due to power supply variation may adversely affect operation of other devices through a power line. Moreover, radiation noise due to the power supply variation may adversely affect reception of radio broadcasting or television broadcasting in an audio device or in a car navigation device.

Thus, conventionally, a plurality of PWM controlled objects is generally divided into a plurality of groups, and the PWM control is applied to each group by shifting the time to start the PWM control for each group. For example, when there are three groups, time to start PWM control is shifted for ⅓ of one period for each group (refer to Japanese Laid-open Patent Publication No. 2008-91311). Accordingly, each group of controlled objects is turned on with different timings.

However, dividing the plurality of PWM controlled objects into groups and starting the PWM control with different timings for each group as described above may sometimes result in overlap of timings when a duty ratio to control each group is different.

Details of a case will be described by referring to FIG. 1 in which PWM control is applied to a first controlled object to a fourth controlled object by outputting a first pulse signal to a fourth pulse signal S1 to S4, respectively.

The four controlled objects are turned on and off according to the four pulses signals S1 to S4. In other words, the four controlled objects are turned on when the four pulse signals S1 to S4 with H level are input. Conversely, the four controlled objects are turned off when the four pulse signals S1 to S4 with L level are input.

For example, a duty ratio of 50% is set for the first pulse signal S1 and the third pulse signal S3, and the first and the third controlled objects are turned on for 50% of one period of the PWM control. A duty ratio of 25% is set for the second pulse signal S2 and the second controlled object is turned on for 25% of one period of the PWM control. Moreover, a duty ratio of 75% is set for the fourth pulse signal S4 and the fourth controlled object is turned on for 75% of one period of the PWM control. Because there are four groups of controlled objects, each group is turned on by shifting ¼ of one period of the PWM control respectively. For example, the first to the fourth controlled objects are turned on at t1, t2, t3, and t4 respectively.

As a result, the first, the second, and the fourth pulse signals, S1, S2, and S4 fall from an H level to an L level substantially simultaneously at time t3. In other words, there is a drawback in which power supply variation may cause, at the same time t3, the first, the second, and the fourth controlled objects to be substantially simultaneously turned off.

SUMMARY

According to various aspects, a timing controller includes a control unit that instructs an operation timing to a controlled unit, and a setting unit that associates a timing obtained by dividing a setting of the operation timing into a plurality of timings with identification number, and sets the control unit so that an offset period based on the associated timing is added to the operation timing of the controlled unit.

Various objects and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 6 illustrates PWM control for a first to a fourth light emitting diodes of a first to a fourth drive controllers according to the various aspects of FIG. 2.

DESCRIPTION OF THE EMBODIMENT

Figure 1:
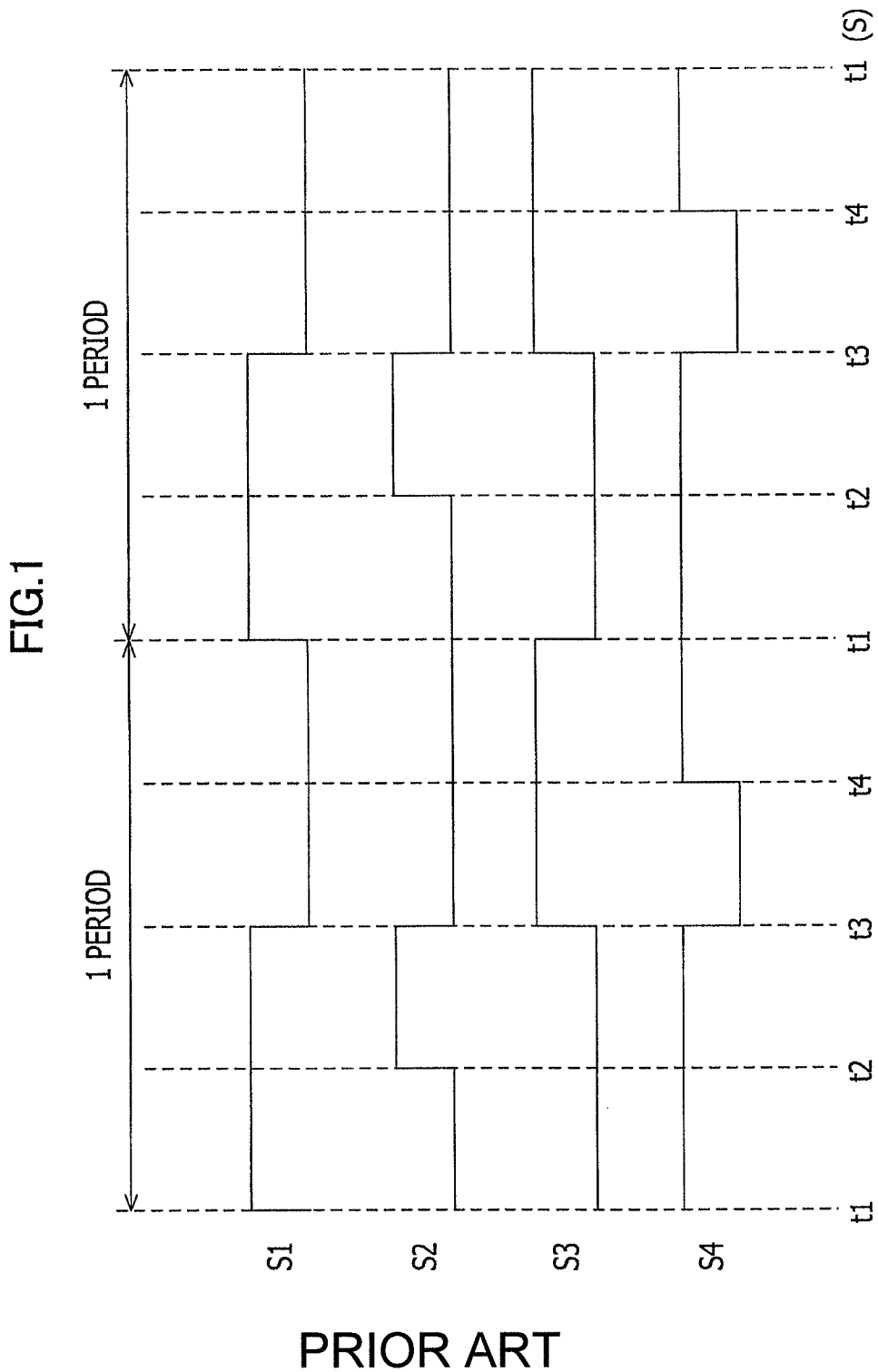
FIG. 1 illustrates a conventional PWM control for four controlled objects.
Figure 2:
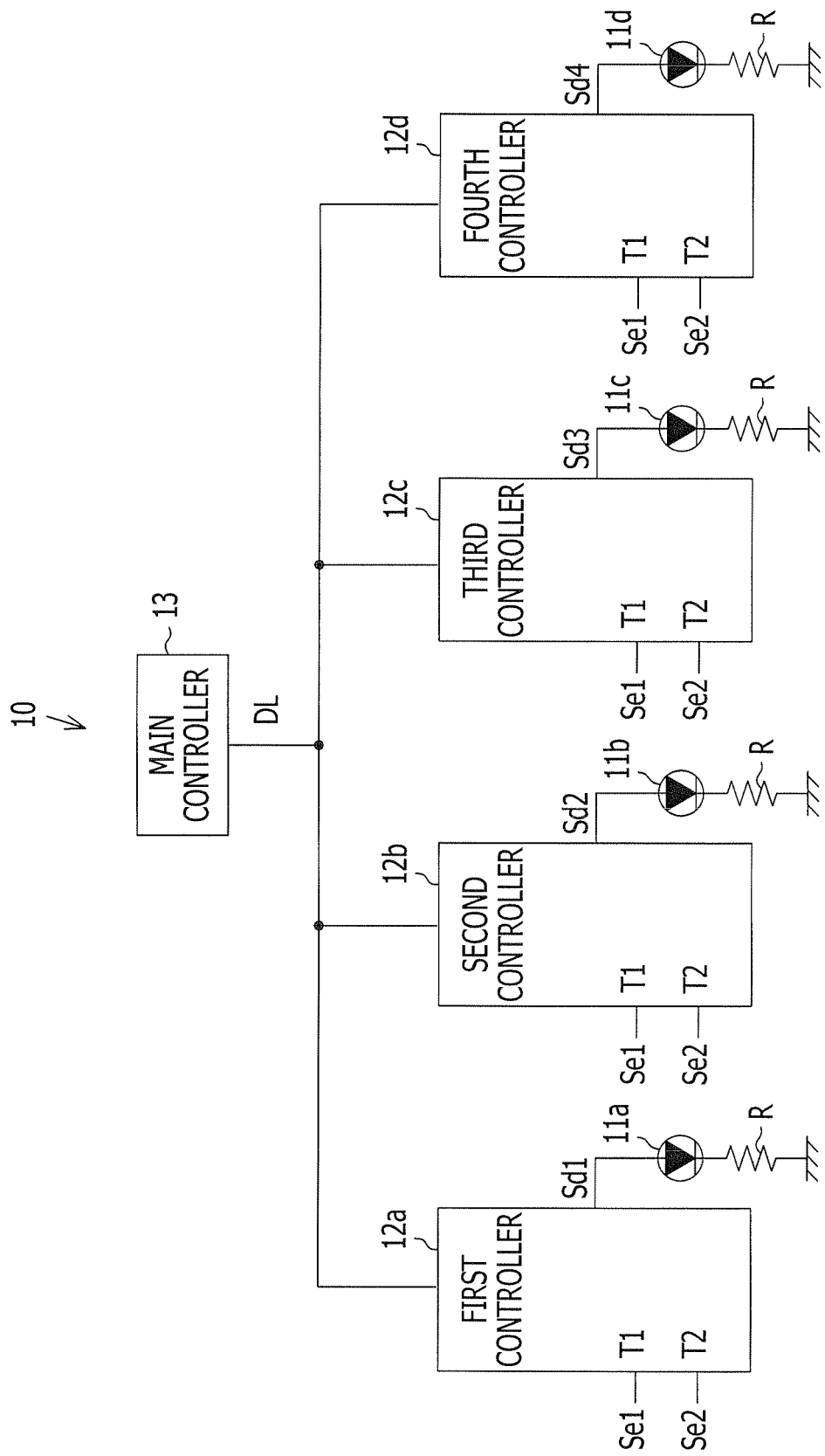
FIG. 2 illustrates a light modulation system according to various aspects.

As illustrated in FIG. 2, a light modulation system 10 as a timing control system includes a first to a fourth light emitting diodes 11a to 11d as controlled units and a first to a fourth drive controllers 12a to 12d as timing controllers for controlling driving each of the light emitting diodes 11a to 11d, respectively. The light modulation system 10 includes a main controller 13 that generates data for illuminating the first to the fourth light emitting diodes 11a to 11d for desired brightness and outputs the data to the corresponding drive controllers 12a to 12d.

According to various aspects, brightness of a light emitting diode as a controlled object is modulated by PWM control at 1 KHz cycle.

According to various aspects, the first to the fourth light emitting diodes 11a to 11d are serially coupled to limiting resistors R respectively and the serial circuits are coupled between corresponding first to fourth drive controllers 12a to 12d and grounds respectively. The first to fourth light emitting diodes 11a to 11d emit light based on drive signals (pulse current) Sd1 to Sd4 that are output from the corresponding first to fourth drive controllers 12a to 12d respectively. In other words, the longer the width of the pulse of drive signals (pulse current) Sd1 to Sd4 that are output from the first to the fourth drive controllers 12a to 12d respectively, the longer the light emitting time becomes and thereby the first to the fourth light emitting diodes 11a to 11d become bright. Conversely, the shorter the width of the pulse of drive signals (pulse current) Sd1 to Sd4 that are output from the first to the fourth drive controllers 12a to 12d respectively, the shorter the light emitting time becomes and thereby the first to fourth light emitting diodes 11a to 11d become dark.

Each of the first to fourth drive controllers 12a to 12d is made up of a semiconductor integrated circuit device (LSI) and sets a pulse width of drive signals (pulse currents) Sd1 to Sd4 that are supplied to the corresponding first to fourth light emitting diodes 11a to 11d based on light modulation setting data DL that is output from the main controller 13 to the first to fourth drive controllers 12a to 12d respectively.

The main controller 13 is made up of a semiconductor integrated circuit device (LSI), may generate light modulation setting data DL and outputs the data to the corresponding first to fourth drive controllers 12a to 12d through signal lines.

Figure 3:
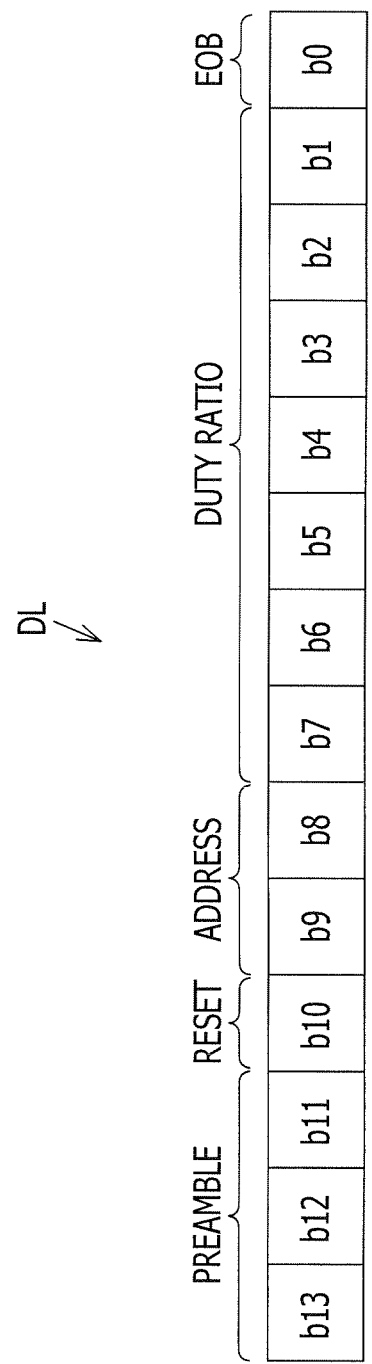
FIG. 3 illustrates a light modulation setting data according to the various aspects of FIG. 2.

The light modulation setting data DL that is output to the first to fourth drive controllers 12a to 12d will be described. FIG. 3 illustrates a format of the light modulation setting data DL according to various aspects. As illustrated in FIG. 3, the light modulation setting data DL is made up of 14 bits. The fourteenth to twelfth bit data, b13 to b11 that are three bits from the most significant bit is a preamble and that indicates a start of the light modulation setting data DL. The eleventh bit data, b10 that is the fourth from the most significant bit indicates reset data for resetting the first to fourth drive controllers 12a to 12d.

The tenth and ninth bit data b9 and b8 that are the fifth and sixth bits from the most significant bit are for specifying addresses of the first to fourth drive controllers 12a to 12d. The eighth to the second bit data b7 to b1 that is seventh to thirteenth from the most significant bit is bit data for specifying a duty ratio (%). The first bit data b0 that is the least significant bit indicates an end of the light modulation setting data DL as End of Block (EOB).

The fourteenth to twelfth bit data b13 to b11 as a preamble is 111, and the first bit data b0 as an EOB is 1. The first to fourth drive controllers 12a to 12d are not reset when the eleventh bit data b10 as a reset signal is 0. Conversely, the first to fourth drive controllers 12a to 12d are reset when the eleventh bit data b10 as a reset signal is 1. Accordingly, setting the eleventh bit data b10 as a reset signal to 0 in the light modulation setting data DL does not reset the first to fourth drive controllers 12a to 12d when modulating the first to fourth drive controllers 12a to 12d. On the other hand, setting the eleventh bit data b10 to 1 as a reset signal in the light modulation setting data DL resets the first to fourth drive controllers 12a to 12d when modulating the first to fourth drive controllers 12a to 12d.

According to various aspects, in the tenth and the ninth bit data b9 and b8 that specifies an address, 00 specifies the first drive controller 12a, 01 specifies the second drive controller 12b, 10 specifies the third drive controller 12c, and 11 specifies the fourth drive controller 12d.

According to various aspects, in the eighth to the second bit data b7 to b1 that specify a duty ratio, "0000000" specifies a duty ratio of 0%, "0011001" specifies a duty ratio of 25%, "0110010" specifies 50%, "1001011" specifies a duty ratio of 75%, and "1100100" specifies a duty ratio of 100%.

For example, the light modulation setting data DL of the first drive controller 12a with a duty ratio of 50% is "11100001100101." The light modulation setting data DL of the second drive controller 12b with a duty ratio of 25% is "11100100110011." The light modulation setting data DL of the third drive controller 12c with a duty ratio of 50% is "11101001100101." The light modulation setting data DL of the fourth drive controller 12d with a duty ratio of 75% is "11101110010111."

A duty ratio of 0% means that the light emitting diode is almost always turned off in one period of the PWM control. A duty ratio of 100% means that the light emitting diode is almost always turned on in one period of the PWM control.

The first to fourth drive controllers 12a to 12d will be described according to various aspects. Circuit configurations of the first to fourth drive controllers 12a to 12d are basically the same, except than the tenth and the ninth bit data b9 and b8 for specifying an address of the modulation setting data DL that is input from the main controller 13 is different, and the light emitting diodes that each of the drive controllers drives and controls are different. A duty ratio of the light modulation setting data DL is set for each of the drive controllers 12a to 12d. Accordingly, there are cases in which the duty ratio becomes substantially equal or different. Thus, the first drive controller 12a will be described in detail and is exemplary of the second to the fourth drive controllers 12b to 12d.

Figure 4:
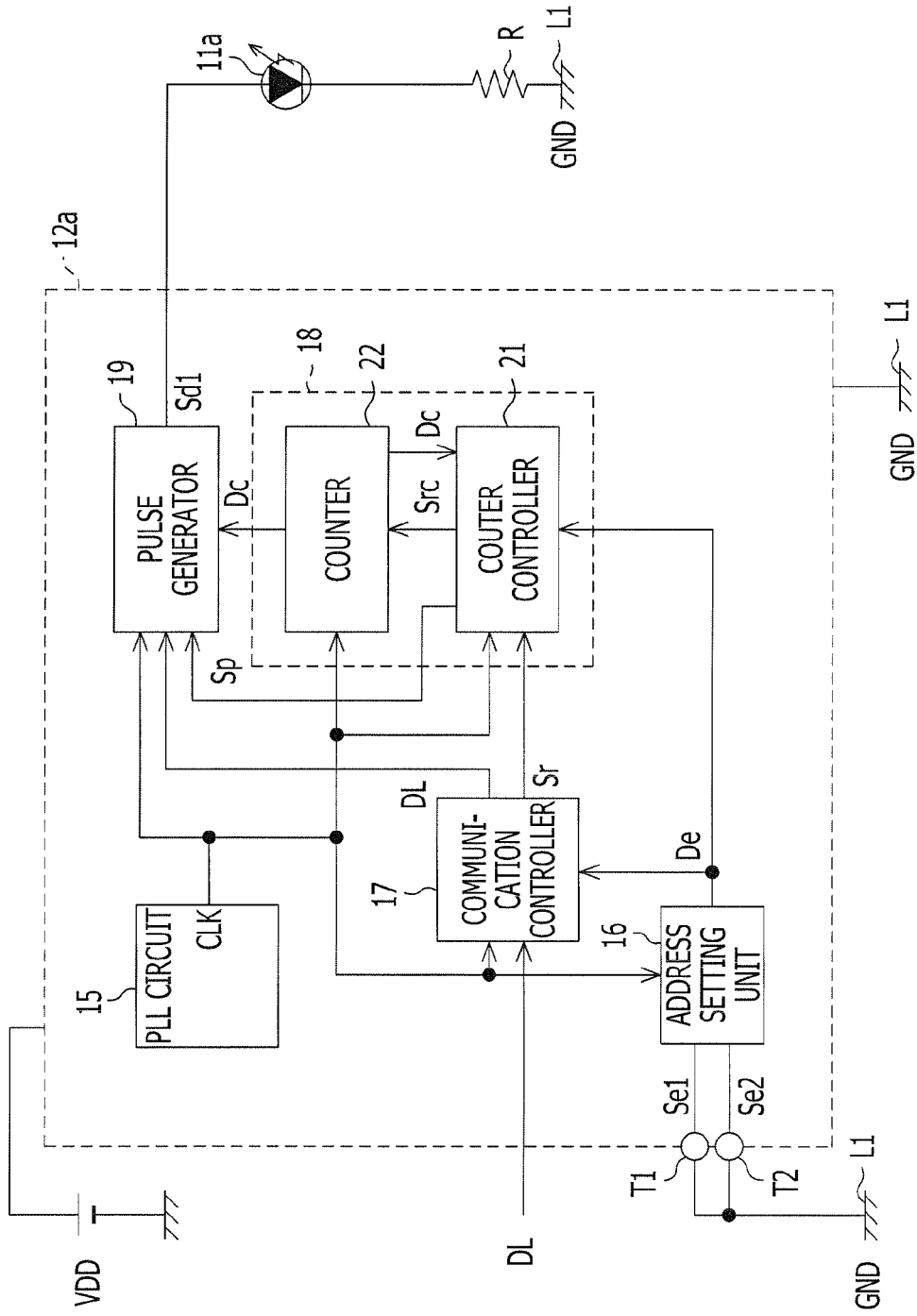
FIG. 4 illustrates a first drive controller according to the various aspects of FIG. 2.

As illustrated in FIG. 4 and according to various aspects, the first drive controller 12a includes a PLL circuit 15, an address setting unit 16, a communication controller 17, a counter 18, and a pulse generator 19 as a control unit. The PLL circuit 15 generates a clock signal CLK for making the address setting unit 16, the communication controller 17, the counter 18, and the pulse generator 19 operate substantially synchronously. According to various aspects, the PLL circuit 15 generates a 10 MHz clock signal CLK. The address setting unit 16, the communication controller 17, the counter 18, and the pulse generator 19 receive clock signals CLK and substantially synchronously operate at 10 MHz.

The address setting unit 16 receives a first slave setting signal Se1 from a first terminal T1 and receives a second slave setting signal Se2 from a second terminal T2. The first terminal T1 and the second terminal T2 are pulled up to a power supply voltage VDD and pulled down to a ground level GND based on a certain address. The address setting unit 16 outputs setting address data De as binary 2 bits of own identification number to the communication controller 17 and the counter 18.

A high order bit of the setting address data De is the first slave setting signal Se1 and a low order bit of the setting address data De is the second slave setting signal Se2. In other words, the address setting unit 16 outputs setting address data De of 11 when the first and the second slave setting signals Se1 and Se2 with H levels are input. Conversely, the address setting unit 16 outputs setting address data De of 00 when the first and the second slave setting signals Se1 and Se2 with L levels are input.

As described above, the address of the first drive controller 12a is set to 00, thereby the first and the second terminals T1 and T2 are coupled to a ground line L1 and pulled down to a ground level GND. The address setting unit 16 receives the first and second slave setting signals Se1 and Se2 with L levels from the first and the second terminals T1 and T2, thereby outputs setting address data De of 00 to the communication controller 17 and the counter 18.

The address of the second drive controller 12b is set to 01, thereby the first terminal T1 is coupled to the ground line L1 and pulled down to the ground level GND, and the second terminal T2 is supplied with the power supply voltage VDD and is pulled up to the power supply voltage VDD. Accordingly, the setting address data De is 01. Moreover, the address of the third drive controller 12c is set to 10, thereby the first terminal T1 is supplied with the power supply voltage VDD and is pulled up to the power supply voltage VDD, and the second terminal T2 is coupled to the ground line L1 and is pulled down to the ground level GND. Accordingly, the setting address data De is 10. Moreover, the address of the fourth drive controller 12d is set to 11, and the first and the second terminals T1 and T2 are supplied with power supply voltages VDD and are pulled up to the power supply voltage VDD. Accordingly, the setting address data De is 11.

The communication controller 17 receives light modulation setting data DL from the main controller 13 and receives setting address data De from the address setting unit 16. According to various aspects, the communication controller 17 determines whether or not the tenth and the ninth bit data b9 and b8 that specify the address of the light modulation setting data DL are substantially the same as the setting address data De when the communication controller 17 receives the light modulation setting data DL.

In other words, the communication controller 17 outputs the light modulation setting data DL to the pulse generator 19 when the tenth and the ninth bit data b9 and b8 that specifies the address of the light modulation setting data DL is substantially the same as the setting address data De. Conversely, the communication controller 17 does not output the light modulation setting data DL to the pulse generator 19 when the tenth and the ninth bit data b9 and b8 that specifies the address of the light modulation setting data DL is different from the setting address data De.

In other words, the communication controller 17 of each of the drive controllers 12a to 12d outputs corresponding light modulation setting data DL to the pulse generator 19 when the main controller 13 outputs the light modulation setting data DL to each of the drive controllers 12a to 12d.

On the other hand, the communication controller 17 outputs a reset signal Sr to the counter 18 when the communication controller 17 receives the light modulation setting data in which the eleventh bit data b10 as a reset signal is 1. In other words, when the communication controller 17 of each of the drive controllers 12a to 12d receives the light modulation setting data DL in which the eleventh bit data b10 as a reset signal is 1, reset signals Sr are output to corresponding counters 18 to substantially synchronize with each of the drive controllers 12a to 12d.

The counter 18 includes a counter controller 21 and a counter 22 as a setting unit, according to various aspects. The counter controller 21 receives a reset signal Sr from the communication controller 17 and receives setting address data De from the address setting unit 16. Moreover, the counter controller 21 receives a count value Dc from the counter 22.

The counter controller 21 calculates a PWM control start value based on the setting address data De when a power supply voltage VDD is supplied. The PWM control start value is a count value DC of the counter 22 that indicates time when the pulse generator 19 starts PWM control of the first light emitting diode 11a (start time). Different count values Dc, such as, for example, the PWM control start values, are set for respective drive controllers 12a to 12d and each of the count values Dc is obtained by (address number−1)×2500. The address number is a value corresponds to the setting address data De. For example, the setting address data De, 00 corresponds to an address number 1, the setting address data De, 01 corresponds to an address number 2, the setting address data De, 10 corresponds to an address number 3, and the setting address data De, 11 corresponds to an address number 4, respectively.

According to various aspects, the PWM control start value of 0 (decimal number) is set to the first drive controller 12a, the PWM control start value of 2500 (decimal number) is set to the second drive controller 12b, the PWM control start value of 5000 (decimal number) is set to the third drive controller 12c, and the PWM control start value of 7500 (decimal number) is set to the fourth drive controller 12d.

According to various aspects, the above described settings are specified so that the first to fourth drive controllers 12a to 12d do not illuminate the corresponding first to fourth light emitting diodes 11a to 11d substantially simultaneously. Therefore, the counter controller 21 sets different PWM start values for the corresponding first to fourth drive controllers 12a to 12d and shifts time to start PWM control of the pulse generator 19.

Moreover, corrected PWM control start values are obtained by applying different offset values to the PWM control start values of the first to fourth drive controllers 12a to 12d. Different count values Dc, in other words, offset values, are set for respective drive controllers 12a to 12d and each of the count values Dc is obtained by (address number−1)×25. According to various aspects, the offset value of 0 (decimal number) is set to the first drive controller 12a, the offset value of 25 (decimal number) is set to the second drive controller 12b, the offset value of 50 (decimal number) is set to the third drive controller 12c, and the offset value of 75 (decimal number) is set to the fourth drive controller 12d.

Accordingly, the corrected PWM control start value of the first drive controller 12a is 0 (=0+0), the corrected PWM control start value of the second drive controller 12b is 2525 (=2500+25), the corrected PWM control start value of the third drive controller 12c is 5050 (=5000+50), and the corrected PWM control start value of the fourth drive controller 12d is 7575 (=7500+75).

In other words, as described above, different PWM control start values are set to respective drive controllers 12a to 12d and the pulse generator 19 of the first to fourth drive controllers 12a to 12d shifts time to start PWM control of the corresponding first to fourth light emitting diodes respectively.

When the first to fourth drive controllers 12a to 12d with different duty ratios perform PWM control of the corresponding first to fourth light emitting diodes 11a to 11d, timings to turn off the first to fourth light emitting diodes 11a to 11d may sometimes overlap.

In order to reduce if not prevent an overlap, a count value Dc (according to various aspects, count values, 0, 25, 50, and 75) is obtained by dividing a substantially minimum unit (according to various aspects, a duty ratio of 1%, and a count value 100 (decimal value)) that allows to apply PWM control to the first to the fourth light emitting diodes 11a to 11d. The obtained count values Dc are typically assigned to each of the drive controllers 12a to 12d (according to the embodiment, count values, 0, 25, 50, and 75) as offset values.

In other words, timings to turn on and turn off the first to fourth light emitting diodes 11a to 11d are not overlapped because offset values are typically set to respective drive controllers 12a to 12d with a unit that is different from a substantially minimum unit that allows to apply PWM control to the first to fourth light emitting diodes 11a to 11d.

The counter controller 21 receives a certain count value DC of the counter 22 from time to time. When the count value Dc reaches the corrected PWM control start value, the counter controller 21 outputs a counter reset signal Src to the counter 22 and outputs an H level PWM start signal Sp to the pulse generator 19. After that, the counter controller 21 continues to output the H level PWM start signal Sp and outputs a counter reset signal Src whenever a count value Dc of the counter 22 counts up a PWM period value 9999, which is described below, until the counter controller 21 receives a new reset signal Src from the communication controller 17.

The PWM start signal Sp is a signal for making the pulse generator 19 perform PWM control of the first light emitting diode 11a. According to various aspects, the counter controller 21 outputs an H level PWM start signal Sp when the counter controller 21 makes the pulse generator 19 start performing PWM control of the first light emitting diode 11a. Conversely, the counter controller 21 outputs an L level PWM start signal Sp when the counter controller 21 does not make the pulse generator 19 start PWM control of the first light emitting diode 11a.

The counter 22 receives a clock signal CLK from the PLL circuit 15 and receives a counter reset signal Src from the counter controller 21. The counter 22 counts up the count value Dc whenever a rise of the input clock signal CLK to an H level is detected. The counter 22 outputs the count value Dc to the pulse generator 19 and the counter controller 21.

The counter 22 resets the count value Dc to 0 according to the counter reset signal Src from the counter controller 21. According to various aspects, the counter 22 receives a 10 MHz clock signal CLK from the PLL circuit 15 and performs PWM control of the first light emitting diode 11a at 1 KHz, thereby the count value Dc is counted from 0 (decimal number) to 9999 (decimal number) in one period of the PWM control.

A duty ratio 100% generally means that the count value Dc is 9999 (decimal number) when PWM control is applied to the first to the fourth light emitting diodes 11a to 11d. Hence, a substantially minimum unit of the duty ratio 1% corresponds to 99 (decimal number) in a count value Dc. According to various aspects, a count value Dc of 9999 (decimal number) that corresponds to a duty ratio of 100% is assumed to be a PWM period value.

According to various aspects, the counter controller 21 outputs a counter reset signal Src to the counter 22 when the count value Dc of the counter 22 reaches the PWM period value 9999 and the counter 22 counts the next clock signal CLK. Thus, after counting a corrected PWM control start value, the counter 22 counts the PWM period value 9999 and is reset whenever the PWM period value reaches 9999 and continues to count PWM period value again.

As a result, after counting the corrected PWM control start value 2525, the counter 22 that is provided in the first drive controller 12a is reset whenever the PWM period value reaches 9999, and continues to count PWM period value again.

After counting the corrected PWM control start value 2525, the counter 22 of the second drive controller 12b is reset whenever the PWM period value reaches 9999, and continues to count PWM period value again. After counting the corrected PWM control start value 5050, the counter 22 of the third drive controller 12c is reset whenever the PWM period value reaches 9999, and continues to count PWM period value again. After counting the corrected PWM control start value 7575, the counter 22 of the fourth drive controller 12d is reset whenever the PWM period value reaches 9999, and continues to count the PWM period value again.

According to various aspects, the pulse generator 19 receives light modulation setting data DL from the communication controller 17 and receives a count value Dc and a PWM start signal Sp from the counter 18. The pulse generator 19 identifies a duty ratio based on the eighth to the second bit data b7 to b1, which is made up of seven bits, in the light modulation setting data DL received from the communication controller 17 and obtains a drive end value from the identified duty ratio. In this case, the duty ratio of the first drive controller 12a is 50% and the count value Dc for a duty ratio 100% is 9999 (decimal value). Hence, the pulse generator 19 assumes the drive end value as 5000 (decimal value).

A drive end value of the second drive controller 12b with a duty ratio of 25% is 2500. A drive end value of the third drive controller 12c with a duty ratio of 50% is 5000. A drive end value of the fourth drive controller 12d with a duty ratio of 75% is 7500.

According to various aspects, the pulse generator 19 compares the count value Dc of the counter 22 with the drive end value obtained from the count value Dc of the counter 22 and the light modulation setting data DL when the pulse generator 19 receives an H level PWM start signal Sp, and outputs an H level drive signal Sd1 to the first light emitting diode 11a until the count value Dc reaches the drive end value or more. In other words, the pulse generator 19 outputs the H level drive signal Sd1 when the count value Dc of the counter 22 is from 0 to 4999, and outputs the L level drive signal Sd1 when the count value Dc of the counter 22 is from 5000 to reset to 9999.

Accordingly, the pulse generator 19 outputs a drive signal Sd1 with a duty ratio of the pulse width is 50% to the first light emitting diode 11a. In other words, the pulse generator 19 turns on the first light emitting diode 11a when the count value Dc of the counter 22 is from 0 to 4999. Conversely, the pulse generator 19 turns off the first light emitting diode 11a when the count value Dc of the counter 22 is from 5000 to 9999. Hence, the first light emitting diode 11a is controlled to turn on and off with a duty ratio of 50%.

The second drive controller 12b outputs an H level drive signal Sd2 when a count value Dc of the counter 22 is from 0 to 2499, and outputs the L level drive signal Sd2 when the count value Dc of the counter 22 is from 2500 to reset to 9999. Hence, the second light emitting diode 11b is controlled to turn on and off with a duty ratio of 25%.

The third drive controller 12c outputs an H level drive signal Sd3 when a count value Dc of the counter 22 is from 0 to 4999, and outputs the L level drive signal Sd3 when the count value Dc of the counter 22 is from 5000 to reset to 9999. Hence, the third light emitting diode 11c is controlled to turn on and off with a duty ratio of 50%.

The fourth drive controller 12d outputs an H level drive signal Sd4 when a count value Dc of the counter 22 is from 0 to 7499, and outputs the L level drive signal Sd4 when the count value Dc of the counter 22 is from 7500 to reset to 9999. Hence, the fourth light emitting diode 11d is controlled to turn on and off with a duty ratio of 75%.

Effects of the above configured light modulation system 10 will be described according to a flow chart in FIG. 5 that illustrates operations of the drive controllers 12a to 12d. In each of the drive controllers 12a to 12d, the counter controller 21 sets the corrected PWM start value based on the setting address data De, and the pulse generator 19 sets a drive end value as an initial value when power supply voltages VDD are supplied to each of the drive controllers 12a to 12d (Operation S1).

According to various aspects, a drive end value 5000 based on the duty ratio of 50% is set to the pulse generator 19 of the first drive controller 12a. A corrected PWM control start value 0 is set to the counter controller 21 of the first drive controller 12a. A drive end value 2500 based on the duty ratio of 25% is set to the pulse generator 19 of the second drive controller 12b. A corrected PWM control start value 2525 is set to the counter controller 21 of the second drive controller 12b. A drive end value 5000 based on the duty ratio of 50% is set to the pulse generator 19 of the third drive controller 12c. A corrected PWM control start value 5050 is set to the counter controller 21 of the third drive controller 12c. A drive end value 7500 based on the duty ratio of 75% is set to the pulse generator 19 of the fourth drive controller 12d. A corrected PWM control start value 7575 is set to the counter controller 21 of the fourth drive controller 12d.

Each of the drive controllers 12a to 12d waits until receiving a reset signal (modulation setting data DL in which the eleventh bit data b10 is 1) from the main controller 13 (Operation S2).

According to various aspects, each one of the drive controllers 12a to 12d waits until receiving a reset signal (modulation setting data DL in which the eleventh bit data b10 is 1) from the main controller 13 (Operation S2: No). The counter 22 counts a clock signal CLK and counts up the count value Dc for 1 (Operation S8), and repeats operations S2, S8, and S9 until the count value Dc of the counter 22 reaches the drive end value or more (Operation S9: No).

If each of the drive controllers 12a to 12d does not receive a reset signal (modulation setting data DL in which the eleventh bit data b10 is 1) even when the count value Dc of the counter 22 reaches the drive end value or more (Operation S9: Yes), outputs an L level drive signal Sd1 to Sd4 to the first to fourth light emitting diodes 11a to 11d and determines whether or not the count value Dc of the counter 22 in Operation S11 is substantially equal to a PWM period value.

In Operation S10, each of the drive controllers 12a to 12d outputs an L level drive signal Sd1 to Sd4, therefore, does not illuminate the first to fourth light emitting diodes 11a to 11d as in a state of waiting the above described reset signal (modulation setting data DL in which the eleventh bit data b10 is 1).

In the Operation S11, each of the drive controllers 12a to 12d proceeds to operation S2 until the count value Dc of the counter 22 becomes substantially equal to the PWM period value (Operation S11: No). Moreover, in Operation S11, when each of the drive controllers 12a to 12d does not receive any reset signal (modulation setting data DL in which the eleventh bit data b10 is 1) from the main controller 13, each of the drive controllers 12a to 12d proceeds to Operation S2 even if the count value Dc of the counter 22 becomes substantially equal to the PWM period value.

Accordingly, each of the drive controllers 12a to 12d waits until receiving a reset signal (modulation setting data DL in which the eleventh bit data b10 is 1) from the main controller 13 (Operation S2: No) under a state in which the drive controllers 12a to 12d are not synchronized without illuminating the first to fourth light emitting diodes 11a to 11d.

According to various aspects, when each of the drive controllers 12a to 12d receives a reset signal (modulation setting data DL in which the eleventh bit data b10 is 1) from the main controller 13 (Operation S2: Yes), each of the drive controllers 12a to 12d (counter controller 21) resets the count value Dc of the counter 22 to 0 (Operation S3). In other words, the drive controllers 12a to 12d reset the count value Dc of the counter 22 to 0 substantially simultaneously and make the counters 22 of the drive controllers 12a to 12d substantially synchronize.

Each of the drive controllers 12a to 12d determines whether or not their address number is 1 (Operation S4). When the address number of the first drive controller 12a is 1 (Operation S4: No), the first drive controller 12a (counter controller 21) outputs a counter reset signal Src to the counter 22 to reset the counter 22, and outputs an H level PWM start signal Sp to the pulse generator 19 (Operation S7).

On the other hand, address numbers of the second to fourth drive controllers 12b to 12d are not 1 (Operation S4: Yes), the counter 22 of each of the second to fourth drive controllers 12b to 12d (counter controller 21) counts clock signals CLK and counts up the count value Dc for 1 (Operation S5).

The second to fourth drive controllers 12b to 12d (counter controller 21) determines whether or not a current count value Dc is substantially the same as the corrected PWM control start value set by the counter controller 21 (Operation S6).

When the count value Dc of the counter 22 is not the same as the corrected PWM control start value (Operation S6: No), each of the drive controllers 12b to 12d returns to Operation S5 and the counter 22 counts clock signals CLK from the PLL circuit 15. In other words, each of the drive controllers 12b to 12d returns to Operation S5 whenever the count value Dc is not the same as the corrected PWM control start value and repeats the operation until the count value Dc becomes substantially the same as the corrected PWM control start value.

When the count value Dc becomes substantially the same as the corrected PWM control start value, the counter controllers 21 of each of the drive controllers 12b to 12d outputs a count reset signal Src to the counter 22 and makes the count value Dc of the counter 22 reset to 0 and outputs an H level PWM start signal Sp to the pulse generator 19 (Operation S7). Accordingly, the second to fourth light emitting diodes 11b to 11d are turned on.

As described above, the pulse generator 19 of the first drive controller 12a outputs an H level drive signal Sd1 in response to the H level PWM start signal Sp in Operation S7 when the main controller 13 outputs a reset signal (modulation setting data DL in which the eleventh bit data b10 is 1), because a corrected PWM control start value of the first drive controller 12a is 0. Accordingly, the first light emitting diode 11a is turned on.

The counter 22 counts a clock signal CLK and counts up a count value Dc for 1 (Operation S8). The counter 22 determines whether or not the count value DC of the counter 22 is the drive end value 5000, which is set to the pulse generator 19, or more (Operation S9).

According to various aspects, the count value Dc of the counter 22 of the first drive controller 12a is less than the drive end value 5000, which is set to the pulse generator 19, because reset is applied immediately before. Thus, the processing returns to Operation S2 and whether or not a new reset signal (modulation setting data DL in which the eleventh bit data b10 is 1) is input is determined. At this time, no new rest signal (modulation setting data DL in which the eleventh bit data b10 is 1) is input (Operation S2: No), the first drive controller 12a returns to Operation S8 again. The counter 22 counts clock signals CLK and counts up the count value Dc for 1. In other words, the processing returns to Operation S9 whenever the counter 22 counts clock signals CLK and repeats the processing until the count value DC becomes substantially the same as the drive end value 5000.

Hence, the first drive controller 12a (pulse generator 19) repeats the above described processing until the count value Dc of the counter 22 reaches the drive end value 5000 and continues to output the H level drive signal Sd1. Accordingly, the first light emitting diode 11a continues to turn on.

When the count value Dc reaches the drive end value 5000 (Operation S9: Yes), the pulse generator 19 of the first drive controller 12a outputs an L level drive signal Sd1 (Operation S10), and the processing proceeds to Operation S11. Accordingly, the first light emitting diode 11a is turned off. The pulse generator 19 of the first drive controller 12a continuously outputs the L level drive signal Sd1 and the first light emitting diode 11a is continuously turned off until the counter 22 is reset and the count value Dc becomes 0.

When the count value Dc reaches the PWM period value 9999 (Operation S11: Yes), the processing returns to Operation S7 and substantially the same processing is repeated until a reset signal Sr is input. Accordingly, the first light emitting diode 11a is controlled to turn on or off with a duty ratio of 50%.

According to various aspects, the second drive controller 12b outputs an H level drive signal Sd2 when a count value Dc of the counter 22 is from 0 to 2499, and outputs an L level drive signal Sd2 to the second light emitting diode 11b when a count value Dc of the counter 22 is from 2500 to 9999. Hence, the second light emitting diode 11b is controlled to turn on and off with a duty ratio of 25%.

According to various aspects, the third drive controller 12c outputs an H level drive signal Sd3 when a count value Dc of the counter 22 is from 0 to 4999. The third drive controller 12c outputs an L level drive signal Sd3 to the third light emitting diode 11c when a count value Dc of the counter 22 is from 5000 to 9999. Hence, the third light emitting diode 11c is controlled to turn on and off with a duty ratio of 50%.

According to various aspects, the fourth drive controller 12d outputs an H level drive signal Sd4 when a count value Dc of the counter 22 is from 0 to 7499. The fourth drive controller 12d outputs an L level drive signal Sd4 to the fourth light emitting diode 11d when a count value Dc of the counter 22 is from 7500 to 9999. Hence, the fourth light emitting diode 11d is controlled to, turn on and off with a duty ratio of 75%.

Moreover, each of the drive controllers 12a to 12d has a different corrected PWM control start value. When a count value Dc of the counter 22 of each of the drive controllers 12a to 12d becomes substantially the same as corresponding corrected PWM control start value, each of the drive controllers 12a to 12d outputs an H level PWM start signal Sp and a counter reset signal Src. Accordingly, the count values Dc of the counters 22 of each of the drive controllers 12a to 12d becomes 0 at different timings and respective count values Dc are different at substantially the same point in time.

Consequently, as illustrated in FIG. 6, rise and fall of each of the drive signals Sd1 to Sd4 may be performed at different timings. For example, when a count value Dc of the first drive controller 12a is assumed to be a standard, and the count value Dc of the first drive controller 12a is 2525, the count value Dc of the second drive controller 12b becomes 0. When the count value Dc of the first drive controller 12a is 5050, the count value Dc of the third drive controller 12c becomes 0. When the count value Dc of the first drive controller 12a is 7575, the count value Dc of the fourth drive controller 12d becomes 0.

Different PWM control start values are typically assigned to the counter controller 21 of each of the drive controllers 12a to 12d. Therefore, the drive signals Sd1 to Sd4 do not rise to an H level substantially simultaneously. Thus, each of the light emitting diodes 11a to 11d illuminates at different timings. Moreover, each of the drive controllers 12a to 12d is typically assigned with different offset values and generates the corrected PWM control start values. Therefore, drive signals Sd1 to Sd4 do not fall to an L level substantially simultaneously. Accordingly, each of the light emitting diodes 11a to 11d is turned off at different timings. As a result, the first to the fourth drive controllers 12a to 12d may turn on and off the corresponding first to fourth light emitting diodes 11a to 11d at different timings. Hence, power supply variation may be reduced.

The counter controllers 21 of each of the drive controllers 12a to 12d largely shift a timing to turn on each of the light emitting diodes 11a to 11d with a corrected PWM control start value. Accordingly, each of the light emitting diodes 11a to 11d does not turn on time close to each other, and thereby power supply variation may be reduced.

According to various aspects, the counter controller 21 of each of the drive controllers 12a to 12d is assigned a PWM control start value and an offset value. The PWM control start value is obtained by substantially equally dividing one period of a PWM control, in which corresponding pulse generator 19 performs PWM control of the first to the fourth light emitting diodes 11a to 11d, by a count value of 2500. The offset value is obtained by substantially equally dividing a substantially minimum unit to perform PWM control by a count value of 25. Accordingly, the first to the fourth drive controllers 12a to 12d make the corresponding first to fourth light emitting diodes 11a to 11d illuminate at timings substantially the furthest apart in one period of a PWM control. Moreover, the first to the fourth drive controllers 12a to 12d may turn off the first to fourth light emitting diodes 11a to 11d at timings substantially the further apart in a count value Dc of a minimum unit that allows to apply a PWM control to the corresponding first to fourth light emitting diodes 11a to 11d. Therefore, power supply variation may be efficiently reduced.

According to the above described aspects, the counter controller 21 adds a PWM control start value and an offset value to obtain a corrected PWM control start value. However, the method to obtain the corrected PWM control start value is not limited to the addition; the counter controller 21 may use an offset value as a corrected PWM control start value.

According to the above described aspects, the counter controller 21 substantially equally divides a PWM control start value and an offset value by the number of drive controllers 12a to 12d. However, PWM control start value and offset value are not limited to those obtained by the above described division. The counter controller 21 may use any PWM control start value and an offset value as long as the values do not overlap each other.

In the above described embodiment, the light modulation system 10 is embodied; however other objects to which PWM control is applied may be embodied. The PWM control is applied to the first to fourth light emitting diodes 11a to 11d. However, the number of objects to which PWM control is applied is not limited.

Figure 5:
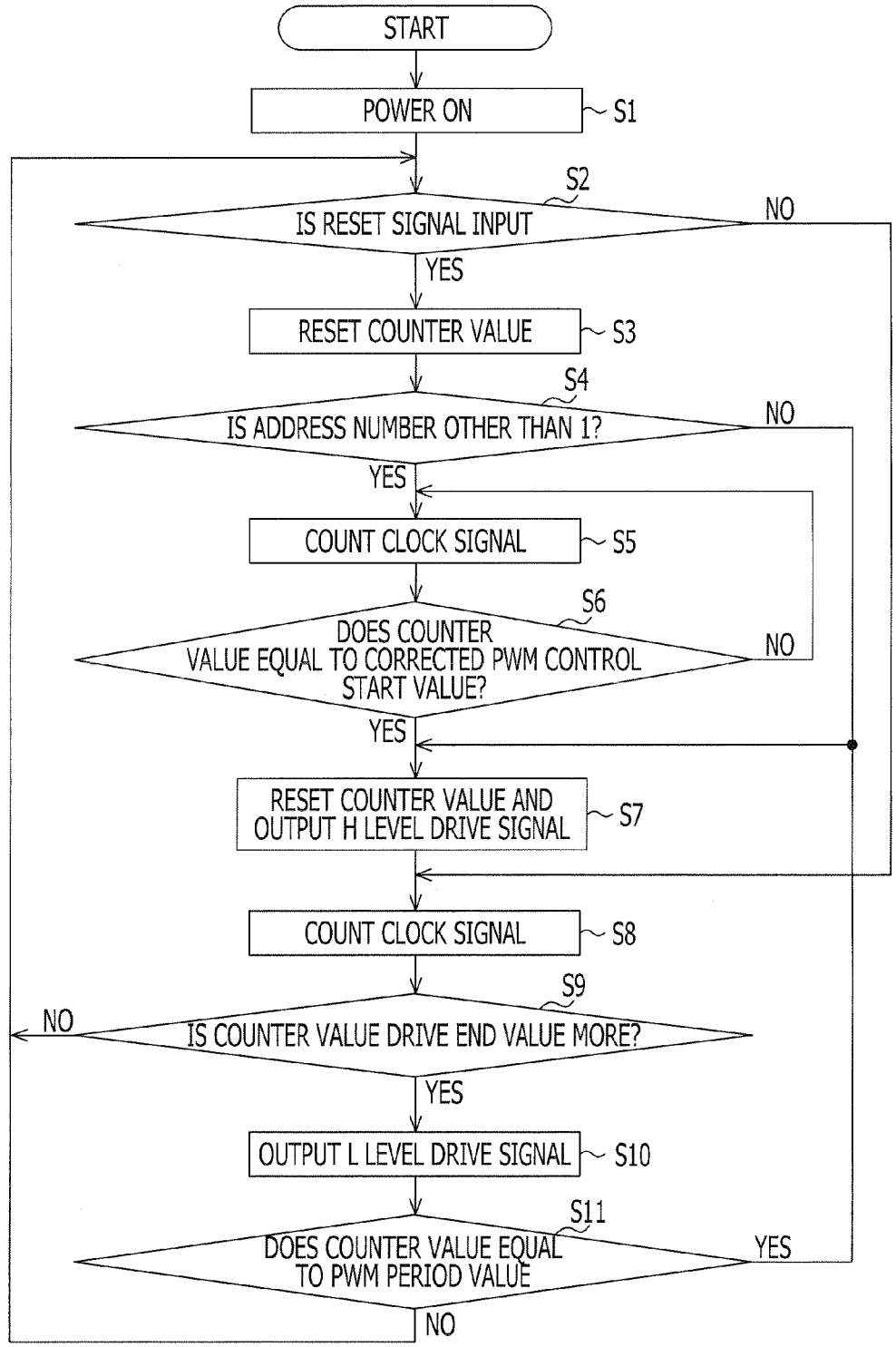
FIG. 5 is a flow chart illustrating settings of a corrected PWM control start value according to the various aspects of FIG. 2.

According to various aspects, there is an interval in which a reset signal (modulation setting data DL in which the eleventh bit data b10 is 1) is not detected (1 count) among Operation S11 to S7 to S8 illustrated in FIG. 5. Accordingly, there may be a case in which a reset is shifted for one count. Accuracy of on-off control may be improved by taking account of the shift due to a loop in which a reset signal is not detected when a switching timing is determined.

According to the above-discussed aspects, a plurality of controlled objects are turned on and off with different timings.

Although various aspects in accordance with aspects of the present invention are numbered with, for example, "first," "second," or "third," the ordinal numbers do not imply priorities of various aspects. Many other variations and modifications will be apparent to those skilled in the art. Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

All examples and conditional language recited herein are intended for pedagogical purposes to aid the reader in understanding the aspects of the invention and the concepts contributed by the inventor to furthering the art, and are to be construed as being without limitation to such specifically recited examples and conditions, nor does the organization of such examples in the specification relate to a showing of the superiority and inferiority of the aspects of the invention. Although various aspects in accordance with aspects of the present invention have been described in detail, it should be understood that the various changes, substitutions, and alterations could be made hereto without departing from the spirit and scope of the invention.

What is claimed is:

1. A timing controller comprising:
   a communication controller configured to receive data including duty ratio information;
   a counter configured to count a count value based on a clock signal and reset the count value based on a reset signal;
   a counter controller configured to calculate a start value based on the duty ratio information, output a comparison result between the count value and the start value as a start signal and output the reset signal when the count value reaches a cycle value; and
   a pulse generator configured to calculate a drive end value based on the duty ratio information and the cycle value, start outputting a drive signal based on the start signal and continue to output the drive signal until the count value exceeds the drive end value.

2. The timing controller according to claim 1, wherein the counter controller is configured to add an offset value to the start value.

3. The timing controller according to claim 2, wherein the offset value is set based on the duty ratio information.

4. A timing control method comprising:
   receiving data including duty ratio information;
   counting a count value based on a clock signal and resetting the count value based on a reset signal;
   calculating a start value based on the duty ratio information, outputting a comparison result between the count value and the start value as a start signal and outputting the reset signal when the count value reaches a cycle value; and
   calculating a drive end value based on the duty ratio information and the cycle value, starting outputting a drive signal based on the start signal and continuing to output the drive signal until the count value exceeds the drive end value.

5. The timing control method according to claim 4, further comprising adding an offset value to the start value.

6. The timing control method according to claim 5, wherein the offset value is set based on the duty ratio information.

7. A timing control system comprising:
   a plurality of timing controllers, each timing controller including:
   a communication controller configured to receive data including duty ratio information;
   a counter configured to count a count value based on a clock signal and reset the count value based on a reset signal;
   a counter controller configured to calculate a start value based on the duty ratio information, output a comparison result between the count value and the start value as a start signal and output the reset signal when the count value reaches a cycle value; and
   a pulse generator configured to calculate a drive end value based on the duty ratio information and the cycle value, start outputting a drive signal based on the start signal and continue to output the drive signal until the count value exceeds the drive end value.

8. The timing control system according to claim 7, wherein the counter controller is configured to add an offset value to the start value.

9. The timing control system according to claim 8, wherein the offset value is set based on the duty ratio information.

10. The timing control system according to claim 8, wherein the respective offset value in each of the plurality of timing controllers is added to the respective start value so that the respective counter controller in each of the plurality of timing controllers outputs the start signal in a different timing.

* * * * *